(12) United States Patent
Schluchter (10) Patent No.: US 7,158,236 B2
(45) Date of Patent: Jan. 2, 2007

(54) HETERODYNE LASER INTERFEROMETER FOR MEASURING WAFER STAGE TRANSLATION

(75) Inventor: W. Clay Schluchter, Los Altos, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 272 days.

(21) Appl. No.: 10/850,811

(22) Filed: May 21, 2004

(65) Prior Publication Data

US 2005/0259268 A1    Nov. 24, 2005

(51) Int. Cl.
*G01B 11/02* (2006.01)
(52) U.S. Cl. .................. 356/500; 356/484; 356/493
(58) Field of Classification Search .............. 356/493, 356/500, 487, 486, 498, 510, 484
See application file for complete search history.

(56) References Cited

U.S. PATENT DOCUMENTS

| 4,334,778 A | * | 6/1982 | Pardue et al. ............... 356/486 |
| 6,208,407 B1 | | 3/2001 | Loopstra |
| 6,285,444 B1 | * | 9/2001 | Osanai et al. ................. 355/72 |

* cited by examiner

*Primary Examiner*—Gregory J. Toatley, Jr.
*Assistant Examiner*—Marissa J. Detschel (57) ABSTRACT

A system for measuring a displacement along a first axis includes an apparatus movable at least along a second axis perpendicular to the first axis, a measurement mirror mounted to the apparatus at an angle greater than 0° relative to the first axis, and an interferometer with a beam-splitter. The beam-splitter splits an input beam into a measurement beam and a reference beam, directs the measurement beam in at least two passes to the measurement mirror, and combining the measurement beam after said at least two passes and the reference beam into an output beam. At least exterior to the interferometer, the measurement beam travels in paths that are not parallel to the first axis.

14 Claims, 9 Drawing Sheets

HETERODYNE LASER INTERFEROMETER FOR MEASURING WAFER STAGE TRANSLATION

DESCRIPTION OF RELATED ART

Figure 1:
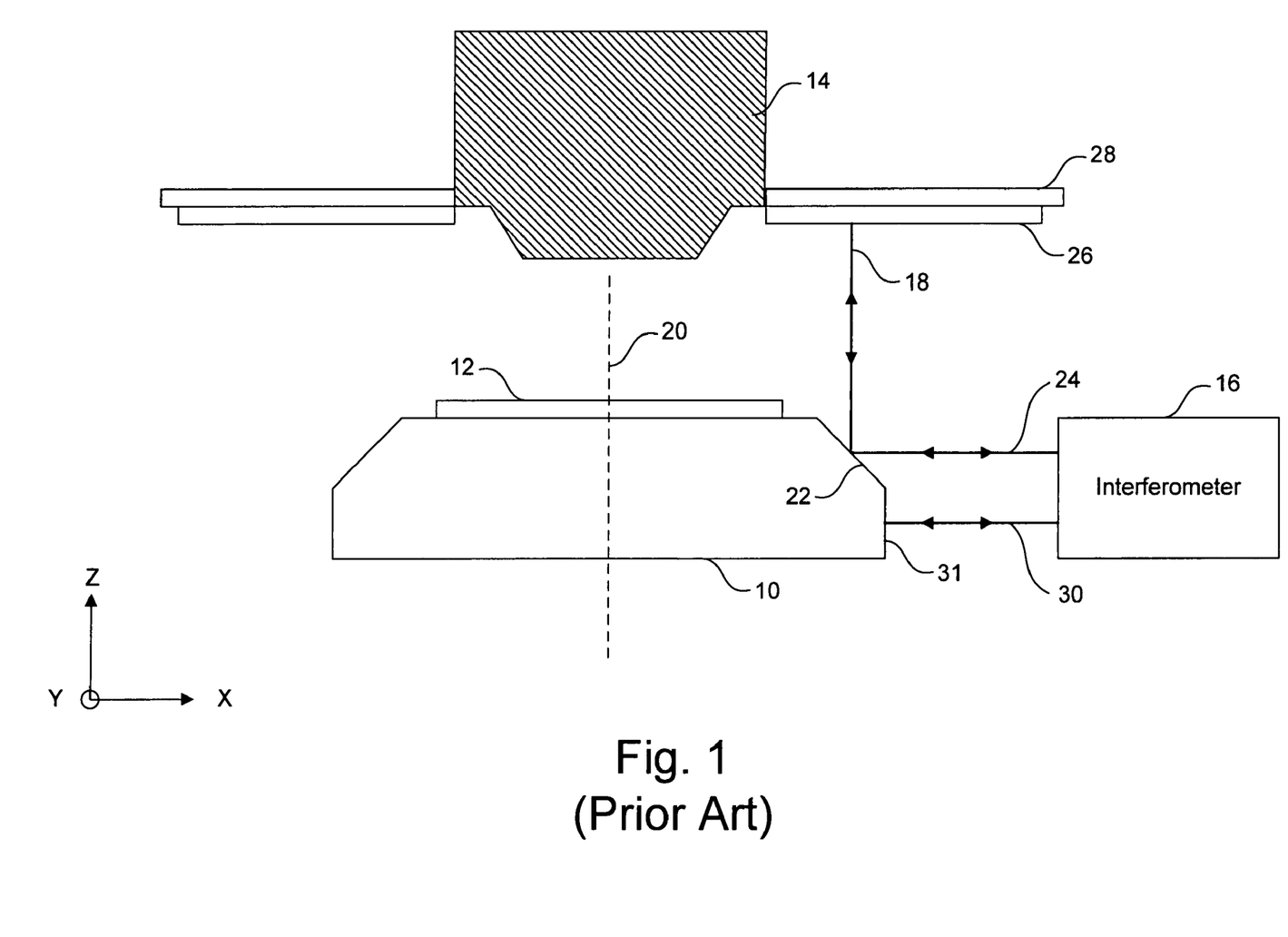
FIG. 1 illustrates a prior art system for acquiring the displacement of a wafer stage along the Z axis.

FIG. 1 illustrates a system for acquiring the position of a stage 10 along a Z axis 20 (e.g., the exposure optical axis or the focus axis). This approach is described in detail in U.S. Pat. No. 6,208,407 to Loopstra. A wafer 12 is supported on stage 10 for exposure by projection optics or exposure tool 14. One advantage of this system is that although the interferometer 16 is positioned at the side of the stage 10, accurate Z axis measurements may be obtained. This is enabled by properly positioning mirrors which establish a Z measuring axis 18 that is parallel to the Z axis 20 of the exposure system. A mirror 22 is arranged at a forty-five degree angle to the movement of stage 10 along the X or Y axis. A measuring beam 24 from interferometer 16 impinges mirror 22 to establish the Z measuring axis 18. A horizontal mirror 26 is attached to structure 28 of the exposure system, so that beam 24 is redirected to mirror 22, which reflects the returned beam 24 to interferometer 16. In addition to measuring beam 24, the interferometer projects a reference beam 30 for reflection from a vertical surface 31 of the stage 10.

As can be seen in FIG. 1, movement of stage 10 along the Z axis 20 will result in a change in the length of the beam path segment from the forty-five degree mirror 22 to the horizontal mirror 26. Thus, while interferometer 16 is located at the side of the stage, the measuring beam 24 has a path segment that varies in length in unity with Z axis displacements of stage 10. In fact, the reflection from horizontal mirror 26 to the forty-five degree mirror 22 provides a second beam path segment that varies in unity with Z axis movement of stage 10. On the other hand, the length of each beam path segment for reference beam 30 is fixed, unless the stage 10 is moved in the X direction.

While the approach described with reference to FIG. 1 operates well for its intended purposes, there are cost concerns, since horizontal mirror 26 is a relatively large reflective component that requires a high degree of planarity. Moreover, as the line widths of the features of integrated circuits decrease, the size of the projection lens of the projection optics 14 increases. In FIG. 1, this would result in an increase of the diameter of the projection optics 14. As a consequence, the requirement of a horizontal mirror 26 to accommodate the entire range of motion of stage 10 imposes a potential difficulty with respect to achieving further reductions of line widths.

SUMMARY

In one embodiment of the invention, a system for measuring a displacement along a first axis includes an apparatus movable at least along a second axis perpendicular to the first axis, a measurement mirror mounted to the apparatus at an angle (θ) greater than 0° relative to the first axis, and an interferometer with a beam-splitter. The beam-splitter splits an input beam into a measurement beam and a reference beam, directs the measurement beam in at least two passes to the measurement mirror, and combining the measurement beam after the two passes and the reference beam into, an output beam. At least exterior to the interferometer, the measurement beam travels in paths that are not parallel to the first axis.

DETAILED DESCRIPTION

Figure 2:
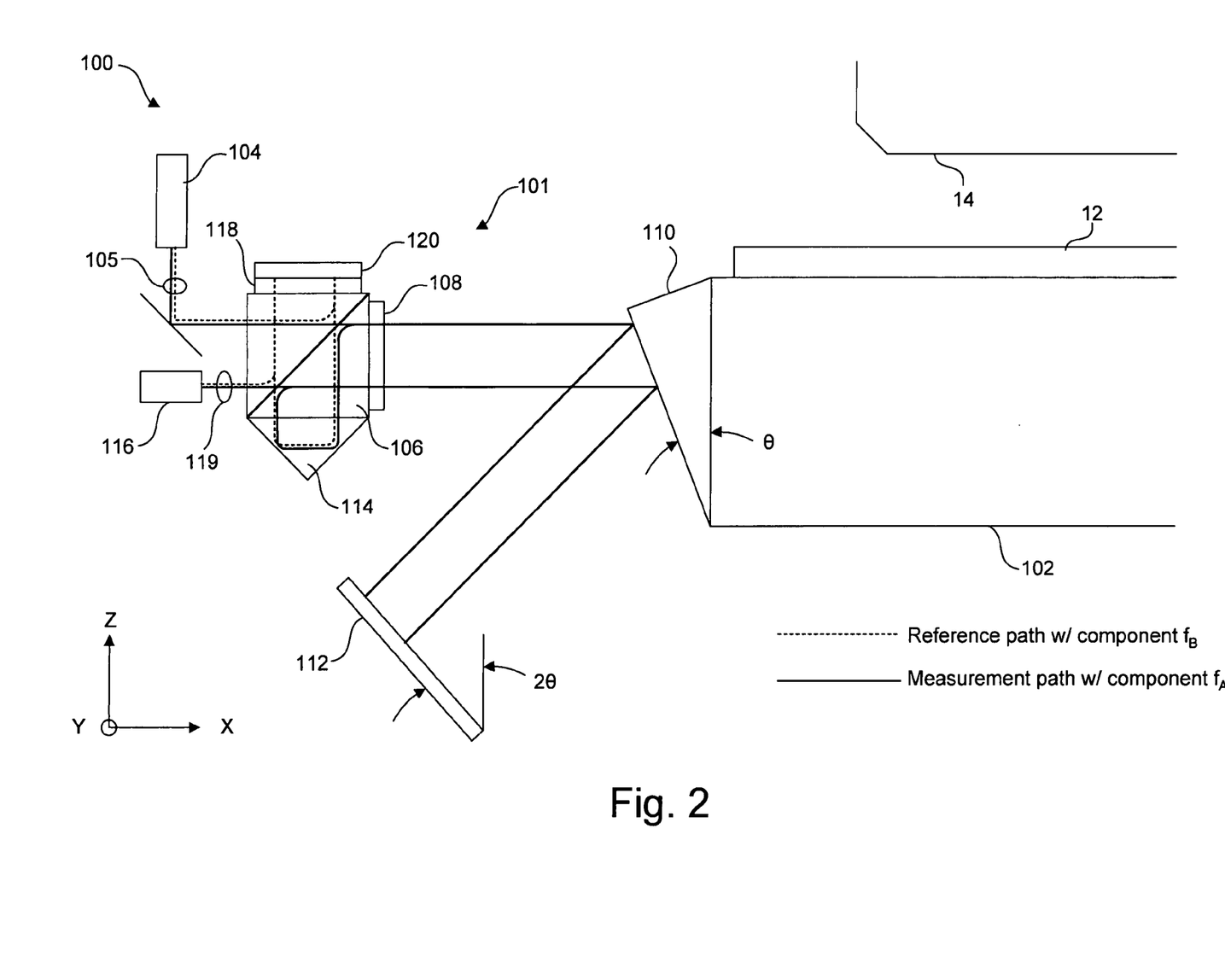
FIGS. 2, 3A, 3B, 4A, and 4B illustrate a system for acquiring the displacement of a wafer stage along the Z axis in one embodiment of the invention.

FIG. 2 illustrates an interferometer system 100 using an interferometer 101 to measure the displacement of a wafer stage 102 along a Z axis (e.g., the lithographic focus axis) in one embodiment of the invention. A laser head 104 generates a coherent, collimated input beam 105 consisting of two orthogonally polarized frequency components. One frequency component $f_A$ (e.g., a measurement beam having a P-polarization) enters the interferometer's measurement path while the other frequency component $f_B$ (e.g., a reference beam having an S-polarization) enters the interferometer's reference path.

In the measurement path, a polarizing beam-splitter 106 transmits frequency component $f_A$ through a quarter-wave plate 108 onto a measurement plane mirror 110. Measurement plane mirror 110 is mounted to the side of wafer stage 102 at an angle θ from the Z axis. Measurement plane mirror 110 reflects frequency component $f_A$ orthogonally onto a beam steering mirror 112. In one embodiment, angle θ is less than 45 degrees so measurement plane mirror 110 reflects frequency component $f_A$ away from wafer stage 102 and avoids the disadvantages of the prior art approach.

Beam steering mirror 112 is angled at 2θ to return frequency component $f_A$ along the input path, at nominal stage orientation (without stage rotation along the Z axis), back to polarizing beam-splitter 106. Since frequency component $f_A$ again passes through quarter-wave plate 108, the returning polarization is rotated 90 degrees and the newly S-polarized frequency component $f_A$ is reflected by polarizing beam-splitter 106 into a cube corner retroreflector 114.

Retroreflector 114 returns frequency component $f_A$ in a parallel but offset path back to polarizing beam-splitter 106, which again reflects frequency component $f_A$ through quarter-wave plate 108 onto measurement plane mirror 110. As similarly described above, measurement plane mirror 110 reflects frequency component $f_A$ orthogonally onto beam steering mirror 112, which returns frequency component $f_A$ along the input path back to polarizing beam-splitter 106. Since frequency component $f_A$ again passes through quarter-wave plate 108, the returning polarization is rotated 90 degrees and the newly P-polarized frequency component $f_A$ is transmitted through polarizing beam-splitter 106 onto a receiver 116.

In the reference path, polarizing beam-splitter 106 reflects frequency component $f_B$ through a quarter-wave plate 118 and orthogonally onto to a reference plane mirror 120. Reference plane mirror 120 returns frequency component $f_B$ along the input path back to polarizing beam-splitter 106. Since frequency component $f_B$ passes again through quarter-wave plate 118, the returning polarization is rotated 90 degrees and the newly P-polarized frequency component $f_B$ is transmitted through polarizing beam-splitter 106 into retroreflector 114. Retroreflector 114 returns frequency component $f_B$ in a parallel but offset path back to polarizing beam-splitter 106.

Polarizing beam-splitter 106 again transmits frequency component $f_B$ through quarter-wave plate 118 and orthogonally onto reference plane mirror 120. Reference plane mirror 120 returns frequency component $f_B$ along the input path back to polarizing beam-splitter 106. Since frequency component $f_B$ again passes through quarter-wave plate 118, the returning polarization is rotated 90 degrees and the newly S-polarized frequency component $f_B$ is reflected by polarizing beam-splitter 106 coaxially with frequency component $f_A$ as an output beam 119 onto receiver 116.

Receiver 116 includes a mixing polarizer, a photodetector (e.g., a photodiode), an amplifier, and phase detection electronics for detecting the phase shift of output beam 119 as stage 102 translates. The phase shift is then correlated to the stage translation. Note that the measurement beam travels only in a plane defined by the Z and the X axes so that any displacement along the Y axis will not affect the measurement of Z displacements. The non-planarity of measurement mirror 110 in the Y direction can affect the measurement of Z displacement, but calibration schemes can reduce this source of error.

Figure 3A:
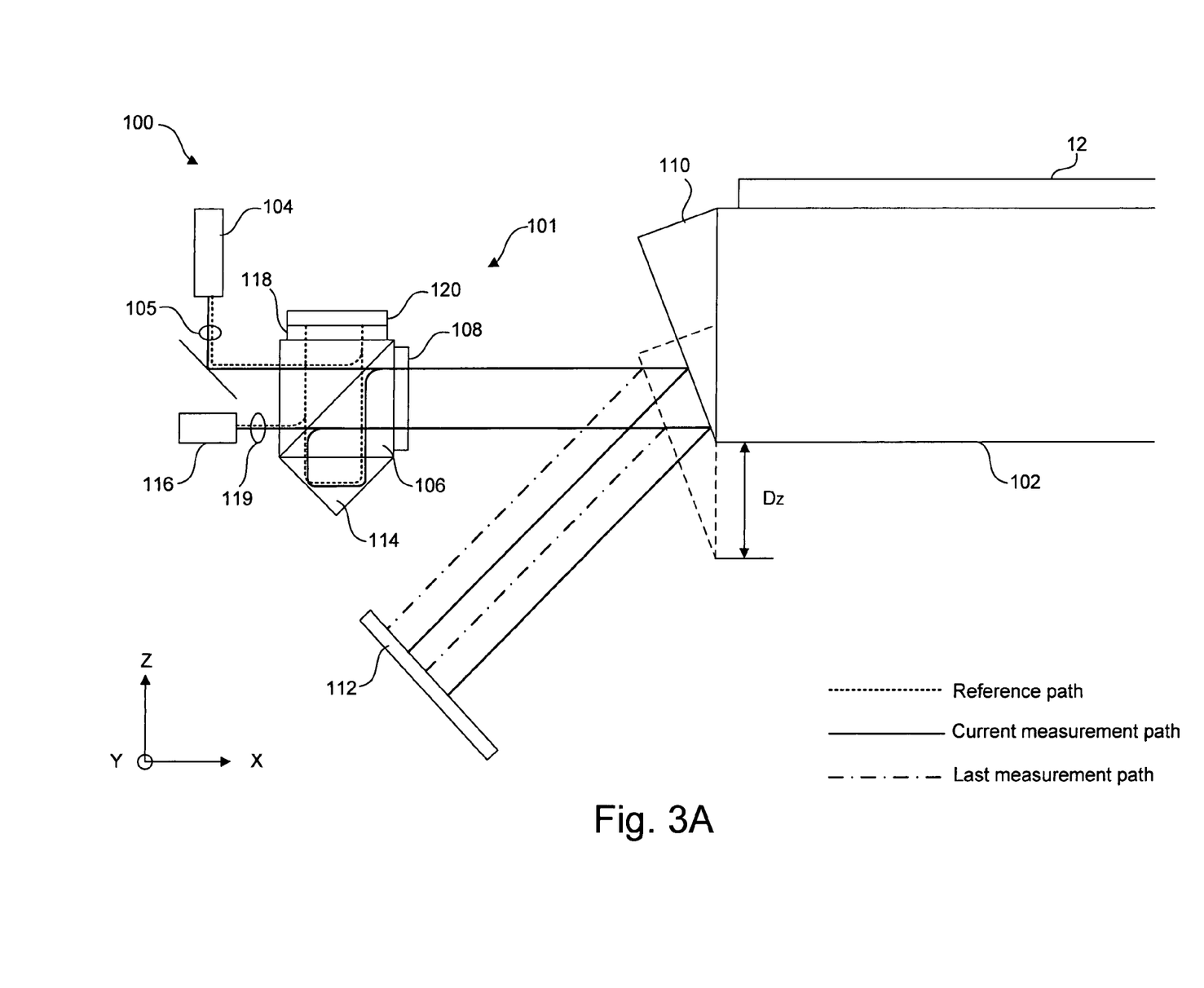
Figure 3B:
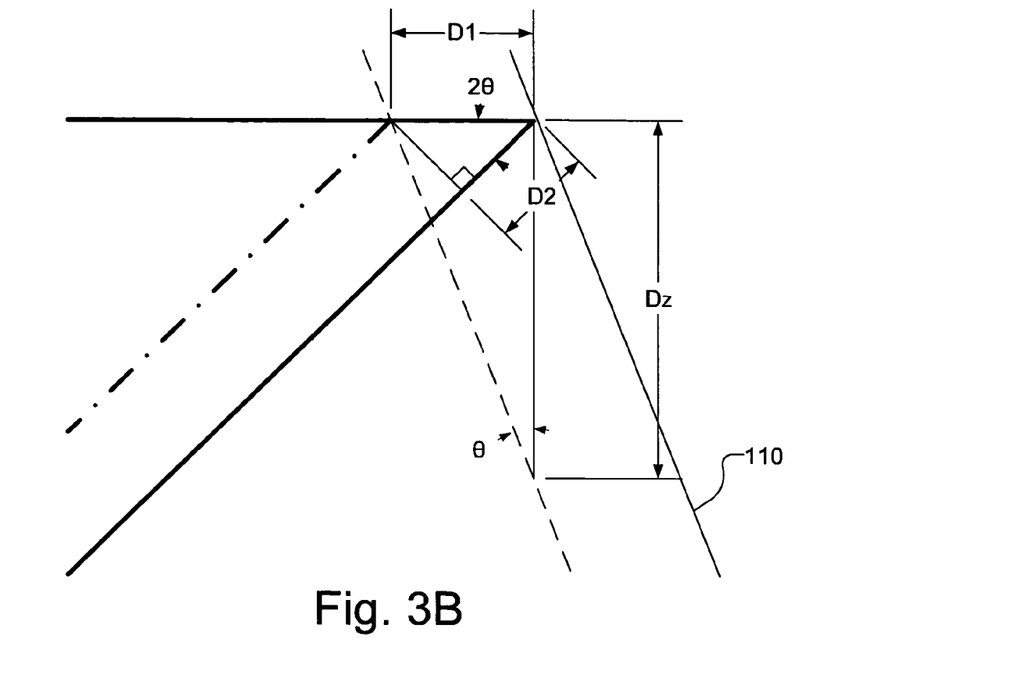

FIGS. 3A and 3B illustrate that if stage 102 translates along the Z axis for a distance of $D_Z$, the distance traveled by the measurement beam is changed by a distance $D_M$. Distance $D_M$ is conventionally determined from the phase shift of output beam 119. Distance $D_M$ is then correlated to the Z displacement $D_Z$ by trigonometry as follows:

$$D_1 = D_Z \tan(\theta); \quad (1)$$

$$D_2 = D_Z \tan(\theta)\cos(2\theta);$$

$D_M = 4(D_1 + D_2)$, which can be rewritten as:

$D_M = 4D_Z \tan(\theta)[1 + \cos(2\theta)]$, which can be rewritten as:

$D_M = 4D_Z \sin(2\theta)$, which can be rewritten as:

$$D_Z = \frac{D_M}{4\sin(2\theta)}.$$

Figure 4A:
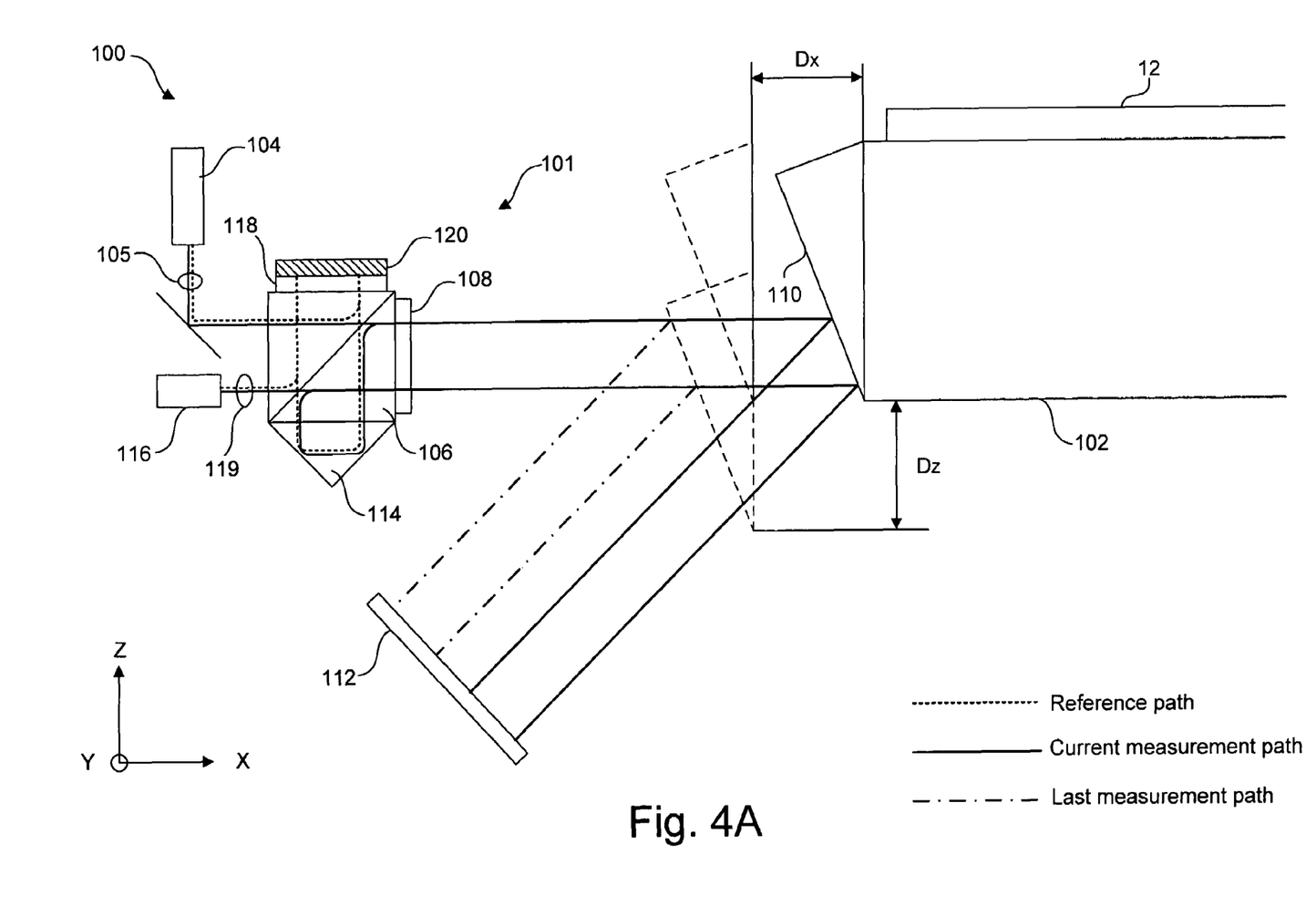
Figure 4B:
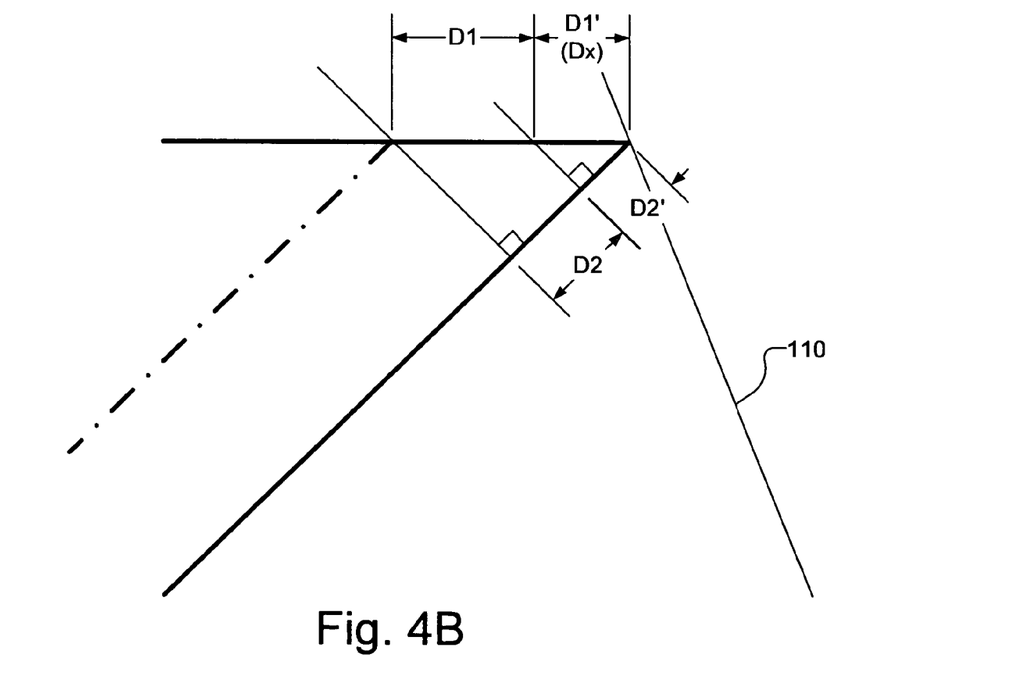

FIGS. 4A and 4B illustrate that if stage 102 translates along both the Z and the X axes, then the measured distance $D_M$ includes components from the Z displacement $D_Z$ and the X displacement $D_X$. Thus, to determine the Z displacement $D_Z$, the X displacement $D_X$ must first be determined. The X displacement $D_X$ can be conventionally determined from another interferometer arranged to measure displacements along the X axis. Once the X displacement $D_X$ is determined, the Z displacement $D_Z$ is determined by trigonometry as follows:

$D_1' = D_X;$ $D_2' = D_X \cos(2\theta);$ $D_M = 4[D_1 + D_1' + D_2 + D_2'],$ which can be rewritten as:

$D_M = 4[D_Z \tan(\theta) + D_X + D_Z \tan(\theta)\cos(2\theta) + D_X \cos(2\theta)],$ which can be rewritten as:

$$D_M = 4D_Z\tan(\theta)[1+\cos(2\theta)] + 4D_X[1+\cos(2\theta)], \quad (2)$$

which can be rewritten as:

$D_M = 4D_Z\sin(2\theta) + 4D_X[1+\cos(2\theta)],$ which can be rewritten as:

$$D_Z = \frac{D_M}{4\sin(2\theta)} - \frac{4D_X[1+\cos(2\theta)]}{4\sin(2\theta)},$$

which can be rewritten as:

$$D_Z = \frac{D_M}{4\sin(2\theta)} - \frac{D_X}{\tan(\theta)}.$$

The same formula can be modified if the measurement beam travels in a plane defined by the Z and the Y axes so that any displacement along the X axis will not affect the measurement of Z displacements.

$$D_Z = \frac{D_M}{4\sin(2\theta)} - \frac{D_Y}{\tan(\theta)}. \quad (3)$$

where $D_Y$ is any displacement along the Y axis. The choice of coordinate system is arbitrary but does affect the signs that appear in the previous equations.

Figure 5:
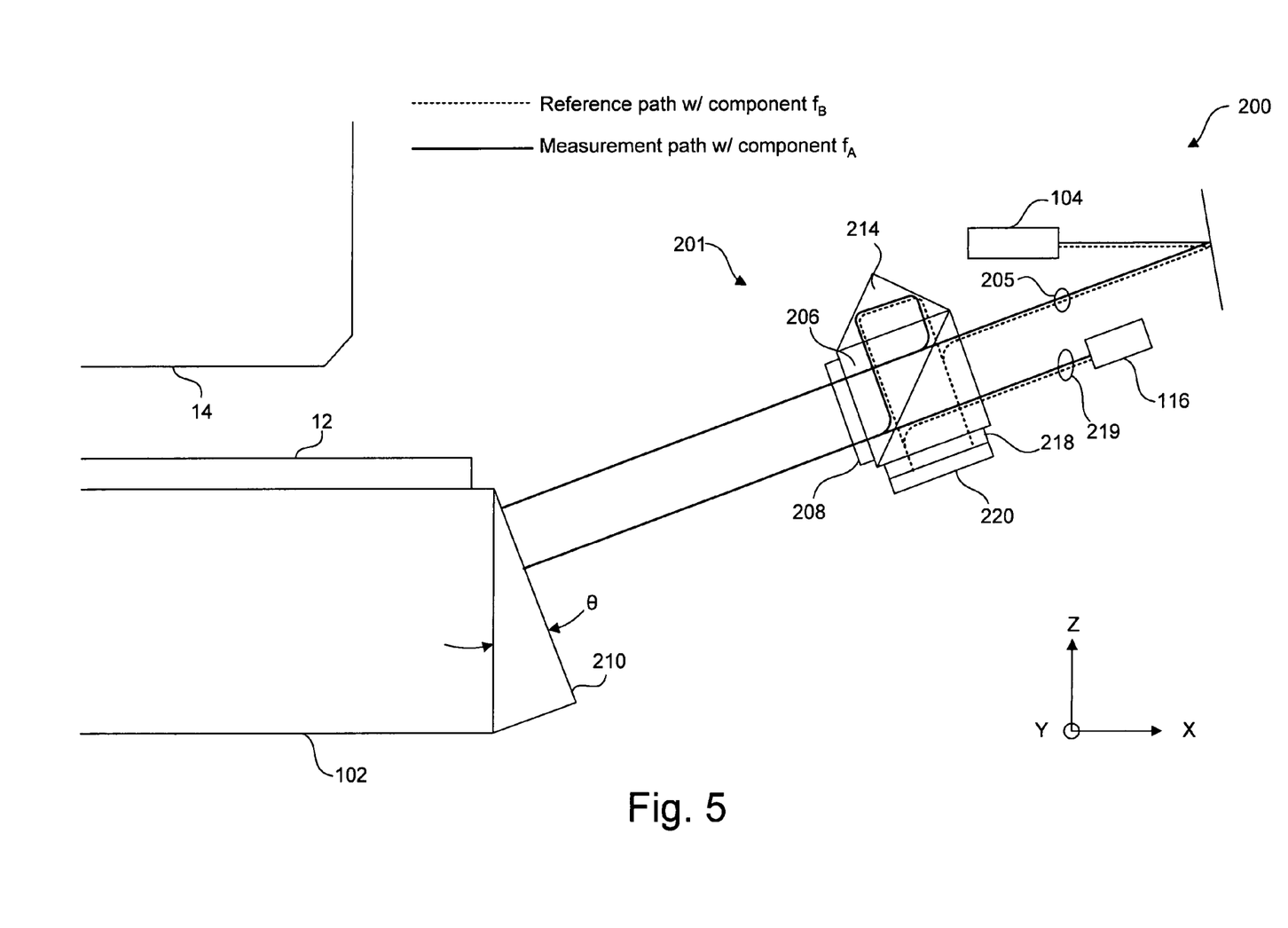
FIGS. 5, 6A, 6B, 7A, and 7B illustrate a system for acquiring the displacement of a wafer stage along the Z axis in another embodiment of the invention.

FIG. 5 illustrates an interferometer system 200 using an interferometer 201 to measure the displacement of a wafer stage 102 along a Z axis (e.g., a lithographic focus axis) in one embodiment of the invention. Laser head 104 generates a coherent, collimated input beam 205 consisting of two orthogonally polarized frequency components. One frequency component $f_A$ (e.g., a measurement beam having a P-polarization) enters the interferometer's measurement path while the other frequency component $f_B$ (e.g., a reference beam having an S-polarization) enters the interferometer's reference path.

In the measurement path, a polarizing beam-splitter 206 transmits frequency component $f_A$ through a quarter-wave plate 208 onto a measurement plane mirror 210. Laser head 104 and interferometer 201 are arranged so that frequency component $f_A$ impinges orthogonally onto measurement plane mirror 210. Thus, measurement plane mirror 210 returns frequency component $f_A$ along the input path, at nominal stage orientation, back to polarizing beam-splitter 206. Since frequency component $f_A$ again passes through quarter-wave plate 208, the returning polarization is rotated 90 degrees and the newly S-polarized frequency component $f_A$ is reflected by polarizing beam-splitter 206 into a cube corner retroreflector 214.

Retroreflector 214 returns frequency component $f_A$ in a parallel but offset path back to polarizing beam-splitter 206, which again reflects frequency component $f_A$ through quarter-wave plate 208 onto measurement plane mirror 210. Again, frequency component $f_A$ impinges orthogonally onto measurement plane mirror 210. Thus, measurement plane mirror 210 returns frequency component $f_A$ along the input path back to polarizing beam-splitter 206. Since frequency component $f_A$ again passes through quarter-wave plate 208, the returning polarization is rotated 90 degrees and the newly P-polarized frequency component $f_A$ is transmitted through polarizing beam-splitter 206 onto receiver 116.

In the reference path, polarizing beam-splitter 206 reflects frequency component $f_B$ through a quarter-wave plate 218 and orthogonally onto to a reference plane mirror 220. Reference plane mirror 220 returns frequency component $f_B$ along the input path back to polarizing beam-splitter 206. Since frequency component $f_B$ passes again through quarter-wave plate 218, the returning polarization is rotated 90 degrees and the newly P-polarized frequency component $f_B$ is transmitted through polarizing beam-splitter 206 into retroreflector 214. Retroreflector 214 returns frequency component $f_B$ in a parallel but offset path back to polarizing beam-splitter 206.

Polarizing beam-splitter 206 again transmits frequency component $f_B$ through quarter-wave plate 218 and orthogonally onto reference plane mirror 220. Reference plane mirror 220 returns frequency component $f_B$ along the input path back to polarizing beam-splitter 206. Since frequency component $f_B$ again passes through quarter-wave plate 218, the returning polarization is rotated 90 degrees and the newly S-polarized frequency component $f_B$ is reflected by polarizing beam-splitter 206 coaxially with frequency component $f_A$ as output beam 219 onto receiver 116.

Similarly described above, receiver 116 includes a photodetector (e.g., a photodiode), an amplifier, and phase detection electronics for detecting the phase shift of the recombined frequency components $f_A$ and $f_B$ as stage 102 translates. The phase shift is then correlated to the stage translation. Note that the measurement beam travels only in a plane defined by the Z and the X axis so that any displacement along the Y axis will not affect the measurement of Z displacements. The non-planarity of the measurement mirror 210 in the Y direction can affect the measurement of Z displacement, but calibration schemes can reduce this source of error.

Figure 6A:
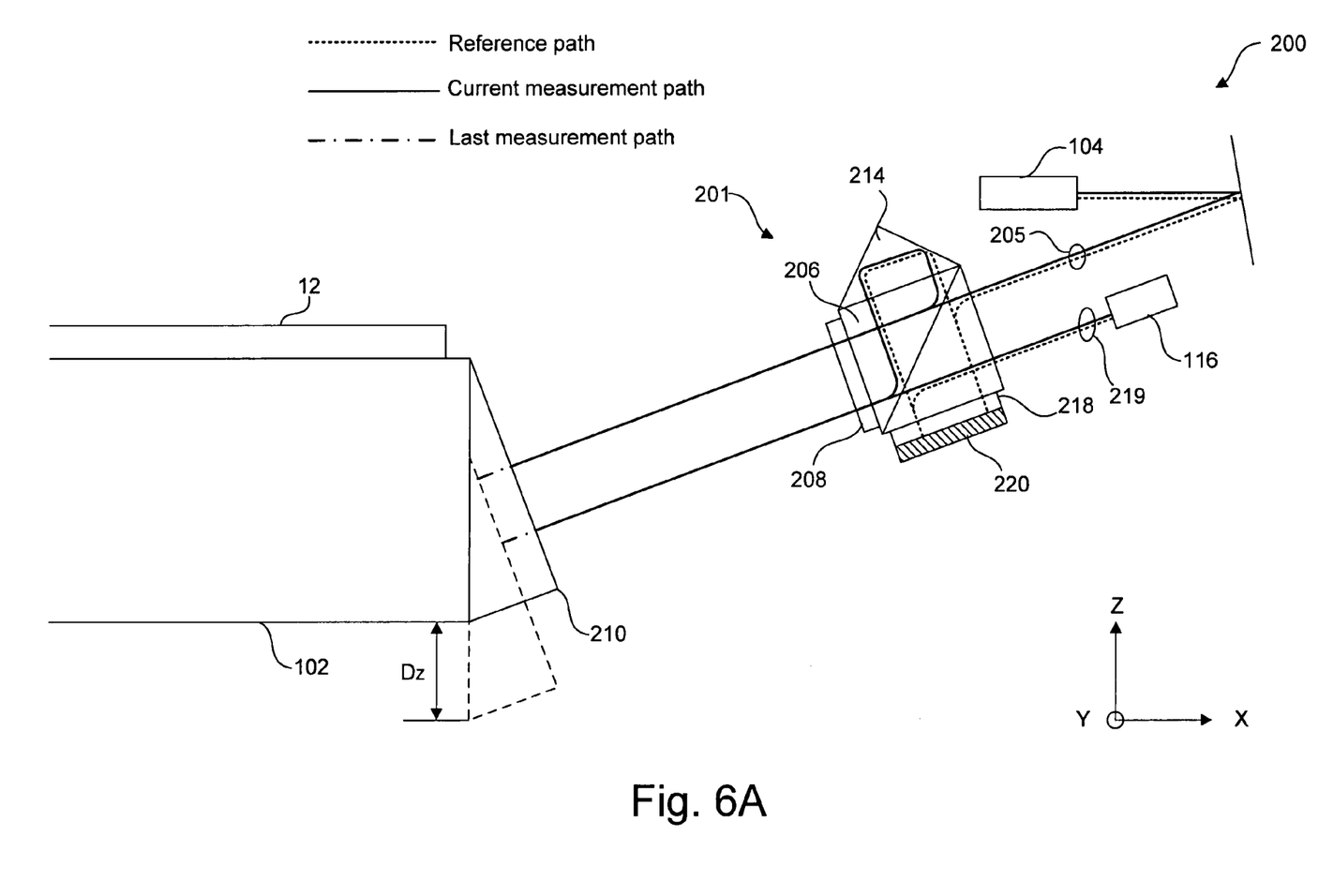
Figure 6B:
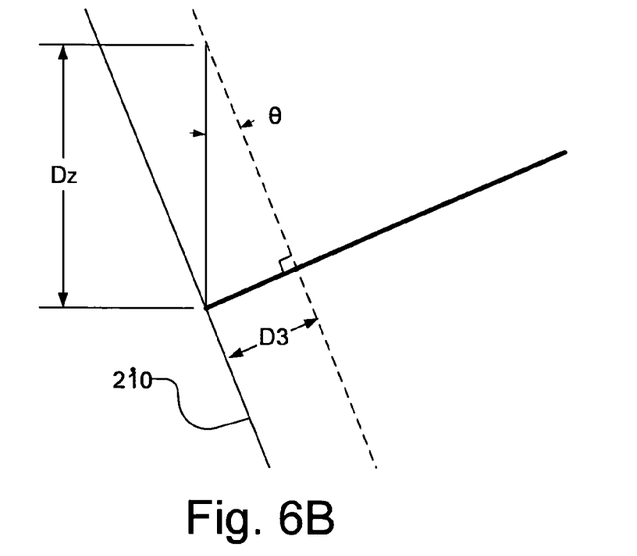

FIGS. 6A and 6B illustrate that if stage 102 translates along the Z axis for a distance of $D_Z$, the distance traveled by the measurement beam is changed a distance $D_M$. Distance $D_M$ is determined from the phase shift of output beam 219. Distance $D_M$ is then correlated to the Z displacement $D_Z$ by trigonometry as follows:

$$D_3 = -D_Z \sin(\theta); \quad (4)$$

$D_M = 4D_3$, which can be rewritten as:

$D_M = -4D_Z \sin(\theta)$, which can be written as:

$$D_Z = -\frac{D_M}{4\sin(\theta)}.$$

Figure 7A:
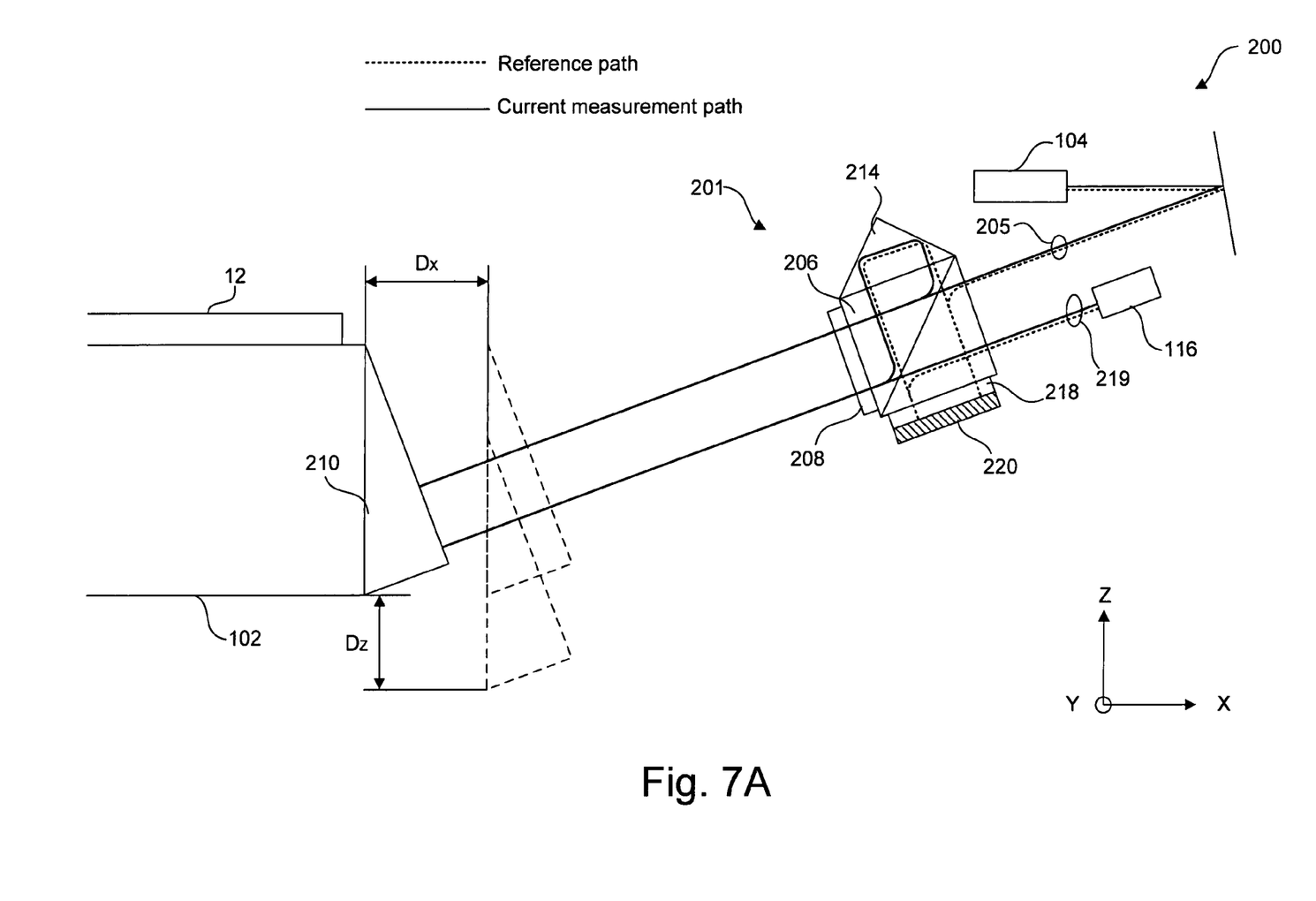
Figure 7B:
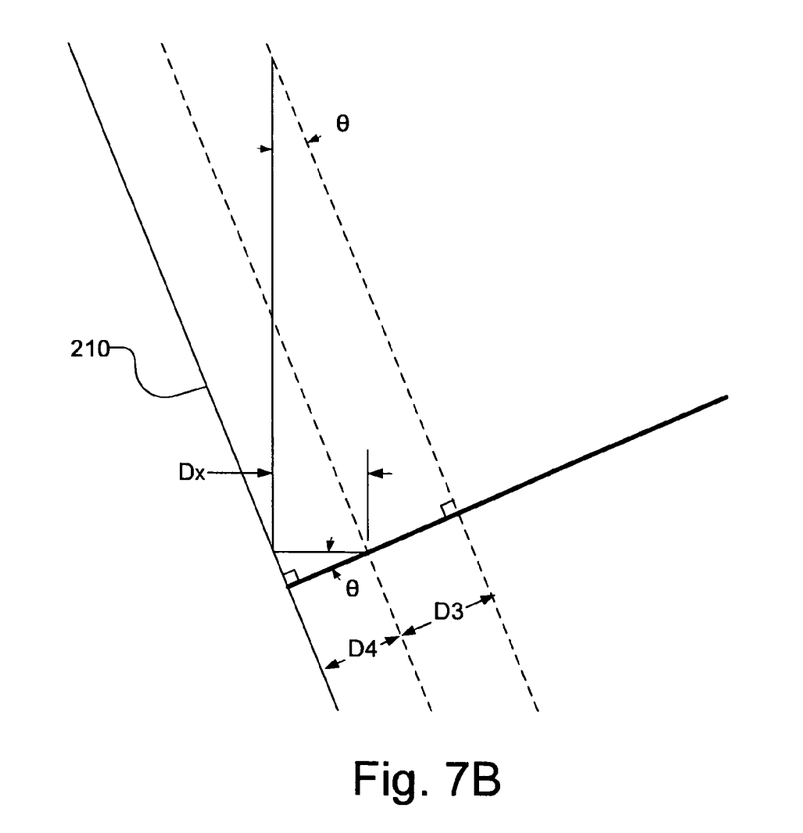

FIGS. 7A and 7B illustrate that if stage 102 translates along both the Z and the X axes, then the measured distance $D_M$ includes components from the Z displacement $D_Z$ and the X displacement $D_X$. Thus, to determine the Z displacement $D_Z$, the X displacement $D_X$ must first be determined. The X displacement $D_X$ can be conventionally determined from another interferometer arranged to measure displacement along the X axis. Once the X displacement $D_X$ is determined, the Z displacement $D_Z$ is determined from by trigonometry as follows.

$$D_4 = -D_X \cos(\theta); \quad (5)$$

$D_M = 4(D_3 + D_4)$, which can be rewritten as:

$D_M = -4D_Z \sin(\theta) - 4D_X \cos(\theta)$, which can be rewritten as:

$$D_Z = -\frac{D_M}{4\sin(\theta)} - \frac{D_X}{\tan(\theta)}.$$

Similarly, equation (5) can be used to determine the Z displacement $D_Z$ if the measurement beam travels in a plane defined by the Z and the Y axes so that any displacement along the X axis will not affect the measurement of Z displacements.

$$D_Z = -\frac{D_M}{4\sin(\theta)} - \frac{D_Y}{\tan(\theta)}. \quad (6)$$

The choice of coordinate system is arbitrary but does affect the signs that appear in the previous equations.

One advantage of the invention results directly from the placement of the measurement plane mirror (e.g., mirror 110 or 210) on the side of the movable apparatus (e.g., wafer stage 102), which allows for a smaller and, more importantly, less costly plane mirror than the prior art. This is because the measurement plane mirror in Loopstra has to accommodate the full range of motion along the X, Y, and Z axes, whereas the measurement plane mirror in the current invention only has to accommodate the full range of motion along two of the axes (e.g., the X and Z axes).

In lithography and other possible optical applications, air showers are provided for purposes such as cooling and reducing contamination. Uniformity of the air shower can be important, since disruption in the air shower can cause fluctuation in the index refraction of air, which in turns cause fluctuations in the phase shift measured by a laser interferometer. By eliminating a horizontal measurement plane mirror as described in Loopstra, the current invention improves the uniformity of the air shower and reduces errors in the interferometry measurements.

Various other adaptations and combinations of features of the embodiments disclosed are within the scope of the invention. While the illustrated embodiments utilize plane mirrors and cube corner retroreflectors, other reflective, refractive, diffractive, and holographic components may be substituted. Furthermore, although nominal stage alignment is described above, the stage may rotate about the Z axis within an angle range that provides enough of a signal to the detector. Numerous embodiments are encompassed by the following claims.

What is claimed is:

1. A system for measuring a displacement along a first axis, comprising:
    an apparatus movable at least along a second axis;
    a measurement mirror mounted to the apparatus at an angle greater than 0° relative to the first axis;
    an interferometer including a beam-splitter for splitting an input beam into a measurement beam and a reference beam, the interferometer directing the measurement beam in at least two passes to the measurement mirror, the interferometer combining the measurement beam after said at least two passes and the reference beam into an output beam, wherein, at least exterior to the interferometer, the measurement beam travels in paths that are not parallel to the first axis; and
    a light source, wherein the light source and the interferometer are oriented to direct the measurement beam to orthogonally impinge the measurement mirror and the measurement mirror reflects the measurement beam back to the interferometer along the same path at nominal stage orientation.

2. The system of claim 1, wherein the interferometer further comprises:
    a first quarter-wave plate;
    a second quarter-wave plate;
    a reference mirror,
    a retroreflector;
    wherein the measurement beam travels in path comprising the beam-splitter, the first quarter-wave plate, the measurement mirror, the first quarter-wave plate, the beam-splitter, the retroreflector, the beam-splitter, the first quarter-wave plate, the measurement mirror, the first quarter-wave plate, the beam-splitter, and a detector; and wherein the reference beam travels in a path comprising the beam-splitter, the second quarter-wave plate, the reference mirror, the second quarter-wave plate, the beam-splitter, the retroreflector, the beam-splitter, the second quarter-wave plate, the reference mirror, the second quarter-wave plate, the beam-splitter, and the detector.

3. The system of claim 1, wherein the apparatus comprises a wafer stage, the first axis comprises a lithographic focus axis, and the second axis is selected from the group consisting of an X axis and a Y axis.

4. The system of claim 3, wherein the interferometer is located outside a range of travel of the wafer stage along the second axis.

5. The system of claim 1, wherein the angle is less than 45° relative to the first axis.

6. The system of claim 1, wherein the measurement beam comprises a first frequency component of the input beam and has a first polarization state, and the reference beam comprises a second frequency component of the input beam and has a second polarization state.

7. The system of claim 1, wherein the displacement along the first axis is measured as follows:

$$D_Z = -\frac{D_M}{4\sin(\theta)} - \frac{D_{X/Y}}{\tan(\theta)},$$

wherein $D_Z$ is the displacement along the first axis, $D_M$ is a change in a distance traveled by the measurement beam, $D_{X/Y}$ is any displacement along the second axis, and $\theta$ is the angle.

8. A method for determining displacements of an apparatus along a first axis, wherein the apparatus is movable at least along a second axis, the method comprising:

using an interferometer to direct a measurement beam in at least two passes to a measurement mirror mounted to the apparatus at an angle greater than 0° relative to the first axis, wherein:
  at least exterior to the interferometer, the measurement beam travels in paths that are not parallel to the first axis;
  the measurement beam is directed to orthogonally impinge the measurement mirror and the measurement mirror reflects the measurement beam back to the interferometer along the same path at nominal stage orientation;

using the interferometer to combine a reference beam and the measurement beam after said at least two passes into an output beam;

detecting a phase change of the output beam;

determining a change in a distance traveled by the measurement beam from the phase change; and determining a displacement of the apparatus along the first axis from the first displacement.

9. The method of claim 8, wherein:

said directing the measurement beam in at least two passes to a measurement mirror comprises directing the measurement beam in a measurement path comprising a beam-splitter, a first quarter-wave plate, the measurement mirror, the first quarter-wave plate, the beam-splitter, a retroreflector, the beam-splitter, the first quarter-wave plate, the measurement mirror, the first quarter-wave plate, the beam-splitter, and a detector;

the reference beam travels in a reference path comprising the beam-splitter, a second quarter-wave plate, a reference mirror, the second quarter-wave plate, the beam-splitter, the retroreflector, the beam-splitter, the second quarter-wave plate, the reference mirror, the second quarter-wave plate, the beam-splitter, and the detector.

10. The system of claim 8, wherein the apparatus comprises a wafer stage, the first axis comprises a lithographic focus axis, and the second axis is selected from the group consisting of an X axis and a Y axis.

11. The method of claim 10, wherein the interferometer is located outside a range of travel of the wafer stage along the second axis.

12. The method of claim 8, wherein the angle is less than 45° relative to the first axis.

13. The method of claim 8, wherein the measurement beam comprises a first frequency component of the input beam and has a first polarization state, and the reference beam comprises a second frequency component of the input beam and has a second polarization state.

14. The system of claim 8, wherein the displacement along the first axis is measured as follows:

$$D_Z = \frac{D_M}{4\sin(2\theta)} - \frac{D_{X/Y}}{\tan(\theta)},$$

wherein $D_Z$ is the displacement, $D_M$ is the change, $D_{X/Y}$ is any displacement along the second axis, and $\theta$ is the angle.

* * * * *

UNITED STATES PATENT AND TRADEMARK OFFICE
CERTIFICATE OF CORRECTION

PATENT NO. : 7,158,236 B2
APPLICATION NO. : 10/850811
DATED : January 2, 2007
INVENTOR(S) : Schluchter It is certified that error appears in the above-identified patent and that said Letters Patent is hereby corrected as shown below:

Column 6, line 64, in Claim 2, after "mirror" delete "," and insert -- ; --, therefor.

Column 7, line 31, in Claim 7, delete "$-\dfrac{D_M}{4\sin(\theta)}$" and insert -- $-\dfrac{D_M}{4\sin(\theta)}$ --, therefor.

Column 8, line 46, in Claim 14, delete "$-\dfrac{D_M}{4\sin(2\theta)}$" and insert -- $-\dfrac{D_M}{4\sin(\theta)}$ --, therefor.

Signed and Sealed this

Fifteenth Day of May, 2007

JON W. DUDAS
*Director of the United States Patent and Trademark Office*